US 6,569,249 B1

(12) United States Patent
Singh et al.

(10) Patent No.: US 6,569,249 B1
(45) Date of Patent: May 27, 2003

(54) PROCESS FOR FORMING LAYERS ON SUBSTRATES

(75) Inventors: Rajendra Singh, Clemson, SC (US); Kelvin F. Poole, Clemson, SC (US)

(73) Assignee: Clemson University, Clemson, SC (US)

( * ) Notice: Subject to any disclaimer, the term of this patent is extended or adjusted under 35 U.S.C. 154(b) by 0 days.

(21) Appl. No.: 09/551,385

(22) Filed: Apr. 18, 2000

(51) Int. Cl.[7] .................................................. B05B 5/00
(52) U.S. Cl. ..................... 118/666; 118/641; 118/623; 118/50.1
(58) Field of Search ................... 118/641, 642, 118/50.1, 621, 623, 300, 666, 667, 712; 427/508, 475; 204/157.15

(56) References Cited

U.S. PATENT DOCUMENTS

| | | | |
|---|---|---|---|
| 3,103,310 A | * | 9/1963 | Lang .............................. 239/4 |
| 4,624,736 A | | 11/1986 | Gee et al. |
| 4,800,100 A | | 1/1989 | Herbots et al. |
| 4,826,585 A | * | 5/1989 | Davis .......................... 204/298 |
| 4,919,077 A | | 4/1990 | Oda et al. |
| 4,986,214 A | | 1/1991 | Zumoto et al. |
| 5,014,646 A | | 5/1991 | Ito et al. |
| 5,174,826 A | | 12/1992 | Mannava et al. |
| 5,183,511 A | | 2/1993 | Yamazaki et al. |
| 5,213,851 A | * | 5/1993 | Snyder et al. .............. 427/576 |
| 5,217,559 A | | 6/1993 | Moslehi et al. |
| 5,319,570 A | | 6/1994 | Davidson et al. |
| 5,342,448 A | | 8/1994 | Hamamura et al. |
| 5,354,420 A | | 10/1994 | Russell et al. |

(List continued on next page.)

FOREIGN PATENT DOCUMENTS

| | | |
|---|---|---|
| DE | 2151809 | 4/1972 |
| EP | 0463863 A1 | 1/1992 |
| EP | 0523314 A1 | 1/1993 |
| JP | 5916327 | 1/1984 |
| JP | 2194164 | 7/1990 |
| JP | 5211120 | 8/1993 |

OTHER PUBLICATIONS

"Semiconductor Manufacturing in the 21$^{st}$ Century", R. Singh, et al., *Semiconductor Fabtech—9$^{th}$ Edition*, pp. 223–232.

"Changing from rapid thermal processing to rapid photo-thermal processing: what does it buy for a particular technology?", R. Singh, et al., *Materials Science In Semiconductor Processing*, 1 (1998) pp. 219–230.

(List continued on next page.)

Primary Examiner—Richard Crispino
Assistant Examiner—Yewebdar T. Tadesse
(74) Attorney, Agent, or Firm—Dority & Manning, P.A.

(57) ABSTRACT

The present invention is generally directed to various processes and systems for forming layers and coatings on substrates, such as semiconductor wafers and solar cells. In one embodiment, the process of the present invention is directed to forming a layer on a substrate from a liquid precursor. The liquid precursor is atomized and exposed to light energy. Besides light energy, the parent material may also be exposed to an electric field and/or to sonic energy. In an alternative embodiment of the present invention a stress measurement device monitors stress in the substrate as a layer is deposited on the substrate. This stress measurement information is then sent to a controller for automatically controlling the amount of energy, such as light energy being emitted onto the substrate.

22 Claims, 8 Drawing Sheets

U.S. PATENT DOCUMENTS

| | | |
|---|---|---|
| 5,356,674 A | 10/1994 | Henne et al. |
| 5,385,633 A | 1/1995 | Russell et al. |
| 5,410,162 A | 4/1995 | Tigelaar et al. |
| 5,423,940 A | 6/1995 | Chen et al. |
| 5,451,260 A | 9/1995 | Versteeg et al. |
| 5,499,602 A | 3/1996 | Cho |
| 5,512,102 A | 4/1996 | Yamazaki |
| 5,522,935 A | 6/1996 | Sato |
| 5,525,158 A | 6/1996 | Tsukazaki et al. |
| 5,526,448 A | 6/1996 | Nagata et al. |
| 5,561,373 A | 10/1996 | Itoh |
| 5,660,773 A * | 8/1997 | Stangle et al. ............. 264/6 |
| 5,681,394 A | 10/1997 | Suzuki |
| 5,698,472 A | 12/1997 | Harris |
| 5,705,235 A | 1/1998 | Lehmann et al. |
| 5,748,318 A | 5/1998 | Maris et al. |
| 5,751,582 A | 5/1998 | Saxena et al. |
| 5,753,320 A | 5/1998 | Mikoshiba et al. |
| 5,755,877 A | 5/1998 | Kamakura et al. |
| 5,763,018 A | 6/1998 | Sato |
| 5,820,942 A | 10/1998 | Singh et al. |
| 5,980,637 A | 11/1999 | Singh et al. |
| 6,174,651 B1 | 1/2001 | Thakur |
| 6,279,502 B1 * | 8/2001 | Azuma ............. 118/663 |

OTHER PUBLICATIONS

"Importance of Rapid Photothermal Processing in Defect Reduction and Process Integration", Rajendra Singh, et al., *Ieee Transactions On Semiconductor Manufacturing*, vol. 12, No. 1, Feb. 1999, pp. 36–43.

"Stress–relieved regrowth of silicon on sapphire by laser annealing", G.A. Sai–Halasz, *Appl. Phys. Lett.*, Vo. 36, No. 6, Mar. 15, 1980, pp. 419–422.

* cited by examiner

PROCESS FOR FORMING LAYERS ON SUBSTRATES

FIELD OF THE INVENTION

The present invention is generally directed to a process and system for depositing a solid material on a substrate and for performing various processing steps (e.g. annealing, diffusion, oxidation, nitrodation, ion-implantation, etc) during the fabrication of semiconductor devices, microelectronics, optoelectronics, photovoltaic systems, flat panel display systems and magnetic devices. More particularly, the present invention is directed to various processes for producing and building layers during the fabrication of integrated circuits. The various processes of the present invention are directed to reducing processing temperatures, reducing processing time, and/or to reducing defects during the fabrication of semiconductor and other related devices.

BACKGROUND OF THE INVENTION

Semiconductor devices, which are typically fabricated on a substrate, refer to devices based on the use of semiconductor materials (inorganic and organic), conductor, and dielectrics for use in a number of fields. An integrated circuit specifically refers to an electrical circuit contained on a single monolithic chip containing active and passive circuit elements. Integrated circuits and other semiconductor devices are fabricated by using various processes such as diffusion (or ion implantation), oxidation, nitrodation, annealing etc, and/or by depositing successive layers of various materials in a preselected pattern on a substrate. The materials can include semiconductive materials such as silicon, conductive materials such as metals, and low dielectric materials such as silicon dioxide, and high dielectric constant materials such as tantalum pentaoxide. Of particular significance, the semiconductive materials contained in integrated circuit chips are used to form almost all of the ordinary electronic circuit elements, such as resistors, capacitors, diodes, and transistors.

Integrated circuits are used in great quantities in electronic devices, such as digital computers, because of their small size, low power consumption, and high reliability. The complexity of integrated circuits range from simple logic gates and memory units to large arrays capable of complete video, audio and print data processing. Presently, however, there is a demand for integrated circuit chips to accomplish more tasks in a smaller space while having even lower operating voltage requirements.

As stated above, integrated circuit chips are manufactured by successively depositing layers of different materials on a substrate. Typically, the substrate is made from a thin slice or wafer of n-type or p-type silicon. The active and passive components of the integrated circuit are built within a thin n-type epitaxial layer on top of the substrate. The components of the integrated circuit can include layers of different conductive materials such as metals and semiconductive materials surrounded by low dielectric insulator materials. In attempting to improve integrated circuit chips, attention has been focused upon not only using different materials to construct the chips but also upon discovering new processes for depositing the various layers of materials on the substrate. For example, various processes and systems for depositing layers on semiconductor wafers are disclosed in U.S. Pat. No. 5,820,942, which is incorporated herein by reference in its entirety.

Currently, the semiconductor industry is switching to using larger diameter silicon wafers (12 inch wafers) in constructing the integrated circuits and to, simultaneously, reducing dimensions within each individual integrated circuit in order to increase the speed of the devices and to reduce the amount of energy needed to run the devices. These needs have created various problems for the circuit manufacturers. For instance, some of the problems and challenges ahead for semiconductor manufacturers are described in an article entitled "Semiconductor Manufacturing in the 21st Century" by Singh, et al., *Semiconductor Fabtech*, 9th Edition 1999, which is incorporated herein by reference.

The planned switching of the IC manufacture to 12 inch size diameter wafers provides a unique opportunity to solve some of the manufacturing problems of other related fields (e.g. solar cells and flat panel display systems). Some of these issues for developing the process and the semiconductor manufacturing equipment are described in an article and titled "Changing the Rapid Thermal Processing to Rapid Photo Thermal Processing: What Does it Buy for a Particular Technology", Singh, et al., *Material Science in Semiconductor Processing*, Vol. 1, 1998, which is also incorporated herein by reference.

In particular, a need currently exists for processes for producing layers in integrated circuits that reduce the number of defects that may occur in the circuits as they are manufactured. Further, a need currently exists for processes that reduce defects without increasing production times.

One known cause of defects in integrated circuits is thermal stress that results from exposing the devices to high temperatures during processing. It is believed that defects caused by thermal stress can be reduced if processing temperatures could be reduced. As such, as need also exists for a process for producing layers in integrated circuits and other semiconductor devices (e.g. solar cells) that reduces the process temperatures that have been used in the past.

SUMMARY OF THE INVENTION

The present invention recognizes and addresses the foregoing disadvantages, and others of prior art constructions and methods.

Accordingly, it is an object of the present invention to provide a process for depositing a material on a substrate.

Another object of the present invention is to provide a process for depositing and adhering a coating or a thin film of a material on a substrate using light energy.

It is another object of the present invention to provide a process for depositing layers on a semiconductor wafer or other substrates such as glass or low-cost polymer substrates.

These and other objects of the present invention are achieved by providing an apparatus and process for heating and forming layers on semiconductor wafers. The apparatus includes a thermal processing chamber adapted to contain one or more semiconductor wafers. The heating device is placed in communication with the thermal processing chamber for heating wafers contained in the chamber. The heating device, for instance, can be a plurality of lamps that emit light energy. Specifically, the lamps can emit thermal energy and optical energy. In one preferred embodiment, the lamps emit ultraviolet light, and vacuum ultraviolet light. In addition to containing a plurality of lamps, the thermal processing chamber can also contain other heating devices, such as an electrical resistance heater or the like.

In order to deposit a material or layer on the wafer, the thermal processing chamber can also include a nozzle through which a precursor material is fed. The precursor material exits the nozzle and is exposed to light energy and/or thermal energy in the processing chamber which causes a layer to form on the wafer. The precursor material can be, for instance, a liquid, a gas, or a mixture of both.

In accordance with one embodiment of the present invention, as the precursor material is fed to the chamber, the material is contacted with sonic energy emitted by a sonic energy device. In one embodiment, when the precursor material is a liquid, the nozzle and sonic energy cause the liquid to form small droplets that are directed towards the wafer.

In an alternative embodiment of the present invention, instead of or in addition to a sonic energy device, the thermal processing chamber can include an electric field for "direct writing" precursor materials onto a substrate. The electric field can be created, for instance, by a focused ion beam, a focused electron beam, or by an electromagnetic field. If focused appropriately, the electric field can be used to direct a precursor material onto a wafer in order to form a pattern on the wafer. For instance, in this embodiment, a metal organic chemical vapor deposition process can be used to apply a metal to a wafer according to a desired configuration.

In still another embodiment of the present invention, a thermal processing chamber includes a stress measuring device for sensing the amount of stress present in a substrate, such as a semiconductor wafer, while the substrate is being heated and/or a coating is being formed on the substrate. For example, a controller can be placed in communication with the stress measuring device. The controller can be configured to receive information from the stress measurement device and, based upon the amount of stress present within the substrate, can control at least one parameter in the thermal processing chamber in order to reduce stress, and therefore lower defects. For instance, the controller can be configured to control the amount of thermal energy or light energy being emitted into the chamber. Alternatively, the controller can be configured to control the amount of precursor material being fed to the chamber or, when the precursor material is a liquid, control the droplet size.

Various stress measurement devices can be used in the present invention including an interferometer, an X-ray detraction device, an optical system that measures the bending or curvature of the substrate, a light source and a color monitor wherein the color monitor monitors color changes in the wafer for measuring stress, a strain gage, or an atomic force microscopy device.

The above described systems can be used not only to process integrated circuits, but can also be used to process other devices, such as solar cells. Thus, a further embodiment of the present invention is directed to a system and process for forming solar cells using a thermal processing chamber that contains a plurality of light sources. Preferably, the light sources emit thermal and optical energy, such as ultraviolet light and/or vacuum ultraviolet light. When processing solar cells, a substrate, such as a semiconductor wafer or glass substrate, can be placed on a conveyor and passed through a processing chamber. Once in the chamber, the substrate can be contacted with light energy and thermal energy originating from heating devices, such as gas furnaces. Further, the chamber can also be equipped to deposit a precursor material on the substrates in order to form various layers in the fabrication of a solar cell.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying figures, in which.

Figure 1:
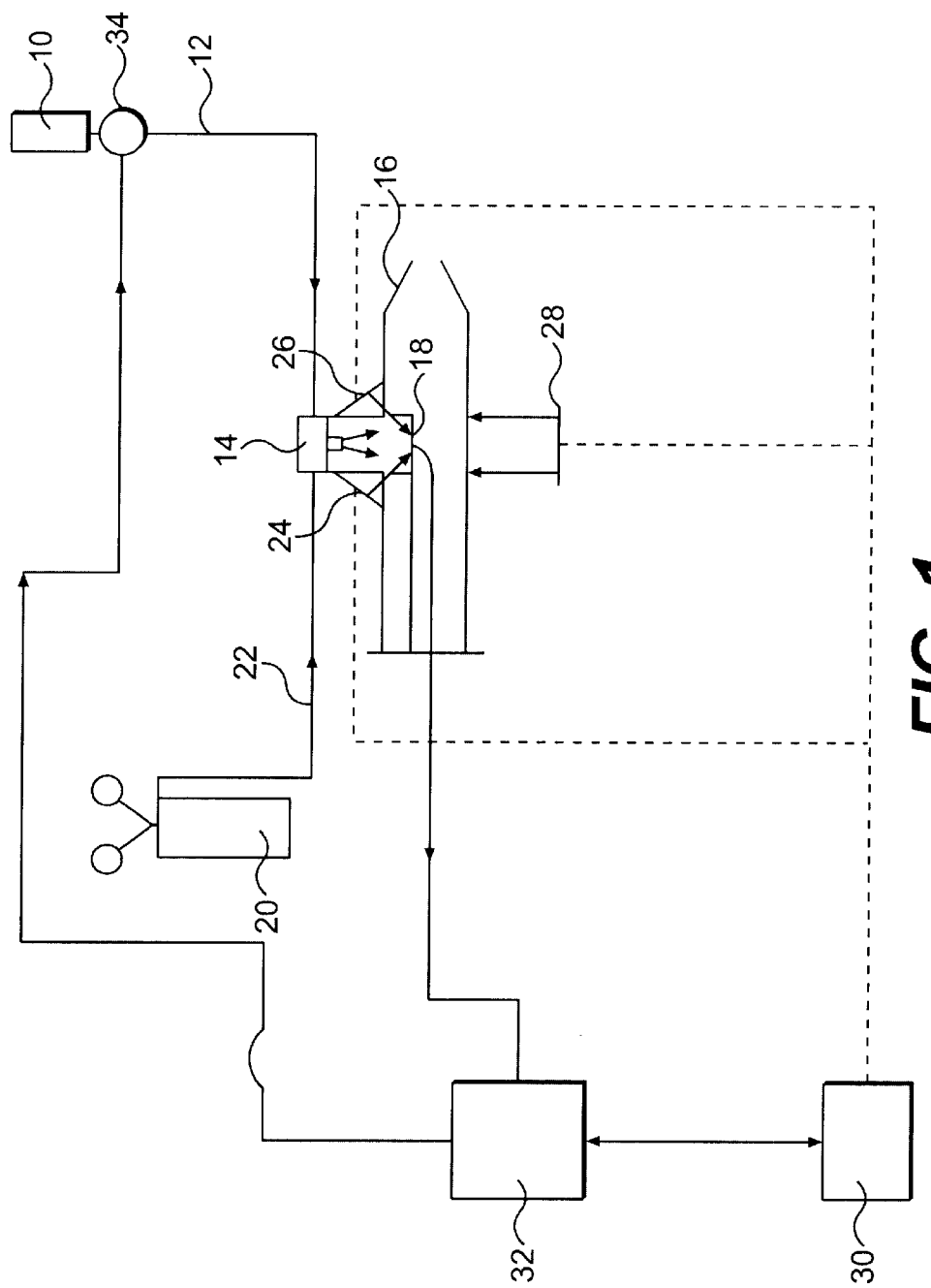
FIG. 1 is a plan view of one embodiment of a system for depositing a solid material on a substrate according to the present invention.

Repeat use of reference characters in the present specification and drawings is intended to represent same or analogous features or elements of the invention.

Detailed Description of Preferred Embodiments

It is to be understood by one of ordinary skill in the art that the present discussion is a description of exemplary embodiments only, and is not intended as limiting the broader aspects of the present invention which broader aspects are embodied in the exemplary construction.

In general, the present invention is directed to a process and system for performing a process step during the fabrication of semiconductor devices. For instance, in one embodiment, the present invention is directed to depositing a solid material on a substrate using light energy. The process of the present invention has many different applications. For instance, in one embodiment, the process of the present invention is well suited to depositing various layers of different materials on a wafer for forming an integrated circuit chip. Conductive materials, semiconductive materials, and insulators can be deposited within an integrated circuit chip according to the process. In another application, the present invention can be used for direct writing (no lithography step is needed) of desired materials on a substrate in sub 100 nm dimensions. Moreover, in another embodiment of the present invention, a process of the present invention can be used in the manufacturing of solar cells based on bulk or thin film technology.

The present invention is directed to various different embodiments for achieving the above objectives. Each embodiment as will be described below offers various benefits and advantages depending upon the particular application. Specifically, in the first embodiment, the present invention is directed to using light energy in combination with sonic energy during the formation of layers on substrates, such as semiconductor wafers. In a second embodiment, the present invention is directed to using light energy in combination with an electric field for forming layers on a substrate. The electric field can be, for instance, a focused ion beam or a focused electron beam. In a third embodiment, the present invention is directed to using light energy and possibly other energy sources in combination with a stress measurement device which measures the stress of a layer that is being formed during the process. By measuring the stress of the layer being formed, automatic adjustments can be made in the processing parameters for forming layers having less defects. In a fourth embodiment, the present invention is directed to using optical energy and thermal energy (burning natural gas is a source of thermal energy) for processing low-cost devices such as solar cells and flat panel display devices etc.

In each of the above embodiments, various advantages are obtained. In particular, the processes of the present invention can be used to reduce processing temperatures during the formation of the layers. Further, processing temperatures can be reduced while forming coatings with superior properties and with less defects than layers made using conventional methods. Further, in some embodiments, the present invention enables the reduction of processing times providing the capability of increasing throughput.

Each embodiment of the present invention will now be described in detail. In the first embodiment, the process of the present invention is directed to subjecting a parent material, such as a liquid, to light energy and sonic energy in a processing chamber for the deposition of thin films on substrates. In particular, this embodiment is well suited to depositing metals, semiconductors, and dielectrics on substrates, such as semiconductor wafers during the manufacture of integrated circuits.

THE USE OF A COMBINATION OF LIGHT ENERGY AND SONIC ENERGY IN PROCESSING CHAMBERS

Figure 2:
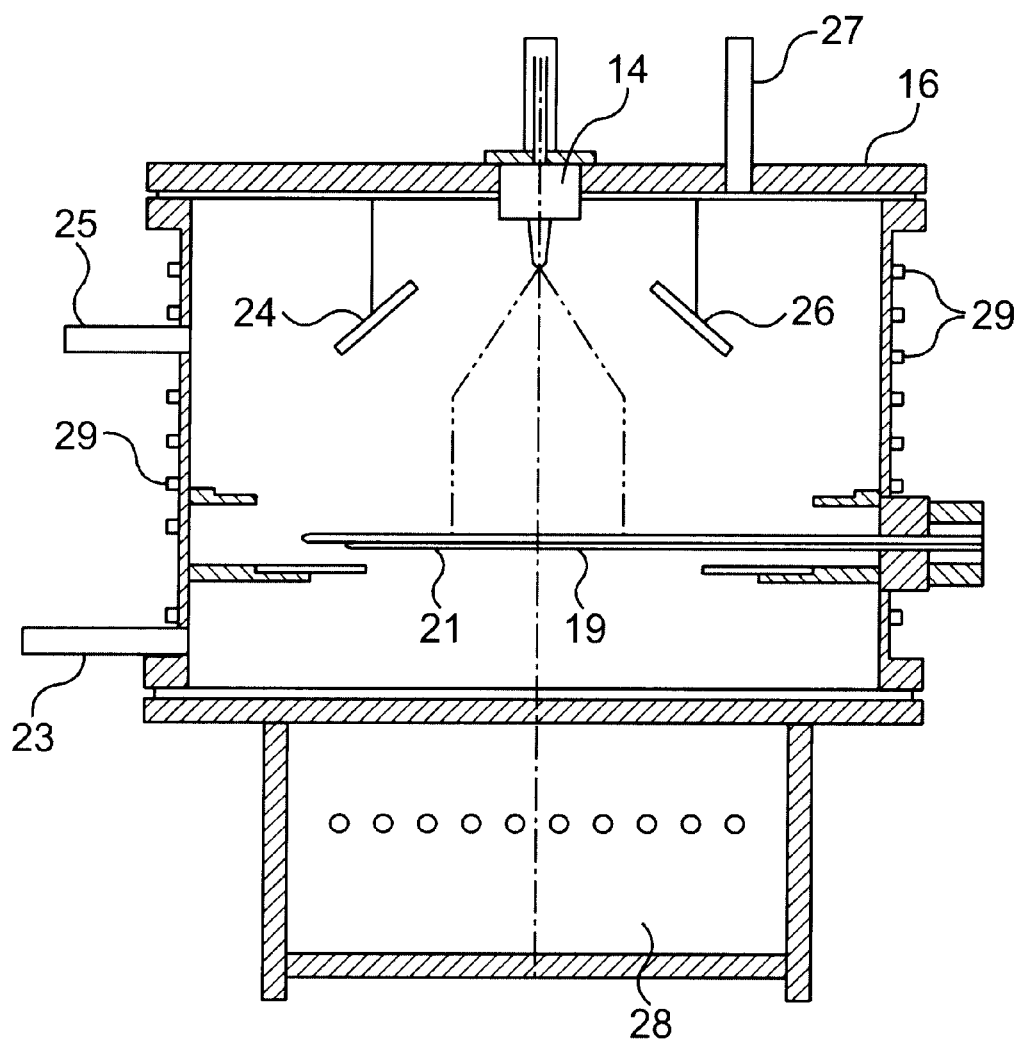
FIG. 2 is a cross sectional view of one embodiment of a reactor vessel that may be used in the system illustrated in FIG. 1.

The first embodiment of the present invention is particularly illustrated in FIGS. 1 and 2. Specifically, a precursor material is injected into a processing chamber under the influence of sonic energy. While the precursor material is being deposited onto a substrate, the material is also subjected to light energy. The light energy includes thermal energy and optical energy. Photons with a wavelength of more than 800 nm provide thermal energy. Photons with a wavelength between about 400 to about 800 nm provide both thermal and optical energy. Photons with a wavelength between about 50 nm and 400 nm, on the other hand, are sources of optical energy. The lower limit of wavelength and the intensity of the optical energy (of the order of nanowatt/$cm^2$ to several milliwatt/$cm^2$) used in the process depends on the interaction of optical energy and the nuclear interactions of the deposited material and the substrate. The wavelengths and the intensity of the optical energy are selected in such a way that during the process the nucleus of the depositing material and substrate are not displaced from their normal thermal position.

By using the combination of light energy and sonic energy, it has been discovered that nanostructure materials with homogenous microstructures can be deposited at low substrate temperatures. Such homogeneous and low stress nanostructure materials are required to provide high performance as well as built in reliability of the devices and circuits that are needed for the next generation of semiconductors and other type devices. Such materials are discussed in an article by Singh, et al. entitled "Role of Rapid Photothermal Processing in Defect Reduction and Process Integration", *IEEE Trans. on Semiconducting Manufacturing*, Vol. 12, No. 1, 1999, which is incorporated herein by reference.

Referring to FIG. 1, a system for converting a liquid precursor into a solid coating on a substrate according to the present invention is illustrated. In order to initiate the process, first a liquid precursor is formulated and placed in a liquid reservoir 10. The liquid precursor contains, in some form, a parent material that is to be later converted into a solid. The liquid precursor can be a pure liquid or can be a solution. For instance, in one embodiment, the liquid precursor can contain the parent material dissolved in a solvent.

It should be understood that besides a liquid precursor, it is also possible to use a gas precursor. In still another embodiment, a liquid precursor can react with a gas being injected near the substrate and a chemical reaction can take place under the influence of various forms of energy causing a solid material to be deposited onto the substrate.

The liquid precursor contained in liquid reservoir 10 according to the present invention is fed by a conduit 12 to a nozzle 14, which is more clearly shown in FIG. 2. Nozzle 14 atomizes the liquid precursor into liquid droplets. The liquid droplets are directly injected into a reactor vessel 16 towards a substrate 18.

In the embodiment illustrated in FIGS. 1 and 2, nozzle 14 atomizes the liquid precursor using a pressurized gas. Specifically, the system includes a gas reservoir 20 in communication with nozzle 14 via a gas conduit 22. The gas that is used to atomize the liquid precursor should not adversely interfere with the deposition process. In most applications, the gas used to atomize the liquid precursor should be an inert gas, such as argon or nitrogen. In some applications, however, as described above the solid material is formed from the liquid precursor by reacting the liquid precursor with an atomizing gas, such as hydrogen.

In general, any suitable atomizing nozzle may be used in the process of the present invention. Also, more than one nozzle maybe used in the system, which, in some applications, may lead to better uniform application of the liquid precursor. In an alternative embodiment to the system illustrated in FIG. 1, a nozzle can be chosen that does not use a pressurized gas in order to atomize a fluid.

In accordance with the present invention, as the liquid precursor is being emitted by nozzle 14, the liquid precursor is subjected to sonic energy, such as ultrasonic energy. In general, sonic energy can be created by creating a pressure differential across the nozzle. The sonic energy assists in atomizing the liquid precursor, accelerates the fluid, and directs the fluid towards a substrate. Further, the sonic energy can also be used to mix the liquid with a gas if desired.

In one embodiment, the differential pressure between the precursor chamber and the processing chamber can be utilized to provide sonic energy. For example, in one preferred embodiment, the atomized fluid is pulsed at a frequency of from about 25 Khz to about 55 Khz. Such sound waves can be used and contacted with a liquid precursor in the above described frequency range. According to the present invention, the amount of sonic energy used is sufficient to form very fine and uniform droplets. For instance, the liquid precursor can be subjected to sonic energy in an amount sufficient to create droplets having a diameter of less than 1 micron, particularly less than 0.5 microns, and even as low as 0.01 microns. By creating very small droplets, all equal in size, the process of the present invention provides the capability of forming very thin layers with a homogenous microstructure.

Once the liquid precursor is atomized and subjected to sonic energy, the resulting liquid droplets are directed towards substrate 18 in reactor vessel 16. During the process, substrate 18 can be rotated and/or scanned to ensure maximum deposition uniformity. Substrate 18 can generally be made from any material as is necessary for the particular application. The substrate also can have any shape. For instance, the substrate can be a wafer, a film, a fiber, a wire, or a ribbon. Further, the substrate can have a three-dimensional conformation, including curved surfaces.

In one preferred embodiment of the present invention, the substrate comprises a semiconductor wafer. Further, the liquid precursor can contain a metal for forming a metal layer on the semiconductor wafer for forming an integrated circuit or other similar device.

According to the present invention, as the liquid droplets are directed towards substrate 18, they are exposed to light energy. For instance, as shown in the figures, substrate 18 is surrounded by lamps 24, 26 and 28. Lamps 24, 26 and 28 can emit either optical energy, thermal energy, or both. Optical energy causes atomic and molecular excitation within the droplets, while thermal energy increases vibrational motion within the droplets. Optical energy can be provided by ultraviolet light, vacuum ultraviolet light, and visible light which is present at wavelengths of from about 0.05 microns to about 0.8 microns. Thermal energy, on the other hand, is contained in light having a wavelength of from about 0.4 microns and higher. Light at wavelengths in the range of from about 0.4 microns to about 0.8 microns provide both optical energy and thermal energy.

As the liquid droplets fall towards substrate 18, the light energy contacting the droplets causes the parent material contained within the liquid precursor to form a solid coating on the substrate. More particularly, the light energy can cause various chemical transformations to occur. For instance, in one embodiment, the liquid precursor can be a solution containing a solvent which is evaporated by the light energy. As the solvent is evaporated, the parent material falls out of solution and forms a solid.

In an alternative embodiment, the liquid precursor, when contacted with the light rays, decomposes or otherwise undergoes a chemical change, transforming into a solid material. In a further embodiment, the light energy causes the liquid precursor to react with a gas, such as the atomizing gas, or to react with other components contained in the solution. This reaction can form a solid material. Regardless of the chemical or physical change that occurs, however, in each application the light energy contacting the droplets transforms components in the liquid ultimately into a solid.

In some applications, only optical energy in combination with sonic energy is necessary for the transformation to occur. In this embodiment, the liquid droplets and reactor vessel 16 are never heated during the process. Alternatively, in other applications, only thermal energy or a mixture of thermal and optical energy are used.

The embodiment illustrated in FIG. 1 is intended to show the use of lamps emitting both thermal and optical energy. Specifically, lamp 28 which is positioned below substrate 18 is used primarily as a thermal energy source for heating the liquid droplets and the substrate. Lamps 24 and 26, on the other hand, are designed primarily for emitting optical energy, such as ultraviolet light including vacuum ultraviolet light, onto the liquid droplets and substrate 18.

Preferably, in most applications, ultraviolet light and particularly vacuum ultraviolet light is present within the processing chamber. It has been discovered by the present inventors that the use of vacuum ultraviolet light at a wavelength of less than about 0.3 microns particularly at wavelengths of less than about 0.2 microns, and more particularly at a wavelength of from about 0.1 microns to about 0.2 microns provide various advantages. For instance, it has been discovered that when vacuum ultraviolet light is present, the quantum potential barrier is significantly reduced. As a result, the processing temperature, processing time as well as microscopic defects are lower when vacuum ultraviolet light is present than in a corresponding pure thermal process. Specifically, the use of vacuum ultraviolet light reduces the activation energy required for the film to form. This results in an enhancement of the bulk and surface diffusion coefficients.

Another advantage to using ultraviolet light is that the films that are formed have reduced surface roughness and reduced interface roughness. Statistical roughening is primarily responsible for the formation of surface roughness and defects. The statistical fluctuation of the incoming atoms is reduced with lower temperature and this results in higher uniformity when vacuum ultraviolet light is present. Further, films formed using vacuum ultraviolet light typically have reduced stress, lower microscopic defects and increased growth rates. It has also been discovered that these advantages are obtained using lower processing times.

Lamps 24, 26 and 28 need to deliver a sufficient amount of energy to the liquid droplets for causing the liquid droplets to vaporize, react, or decompose and transform the parent material into a solid. Generally, the amount of energy required will depend upon the size of the liquid droplets and the time it takes for the droplets to travel from nozzle 14 to substrate 18.

Besides causing the parent material contained within the liquid precursor to form a solid, the light energy emitted by lamps 24, 26 and 28 can also provide other benefits and advantages. For instance, in one application, substrate 18 can be contacted by the light rays causing the substrate to adhere more firmly to the parent material as it is coated upon the substrate. For instance, the light rays may change the electrostatic attraction between the substrate and the parent material and provide lower bulk and surface defects.

Various incoherent light sources that may be used in the system of the present invention include arc lamps, deuterium lamps, and tungsten halogen lamps, which emit both thermal and optical energy. Lamps that primarily emit ultraviolet light and can be used in the present invention include deuterium lamps, mercury vapor lamps, xenon lamps, and incoherent excimer lamps. The amount of energy emitted by the lamps can vary depending upon the circumstances. In general, and with particular reference to optical energy, the intensity and energy of the photons must be low enough so that only electronic excitation takes place, but no nuclear displacement is involved. For most applications, the incoherent light source lamps should provide to the reaction chamber from about 1.5 eV to about 20 eV of energy. As many lamps as are necessary for the process may be used and the lamps may be placed in any suitable configuration. The location of the lamps illustrated in FIG. 1 is merely exemplary.

The lamps used in the process of the present invention should generally provide light rays throughout most of the reaction vessel to ensure that the liquid droplets are constantly being exposed to light energy as they travel towards substrate 18. In this regard, lamps emitting small focused rays of light and lasers are not particularly well suited for use in the present invention. Thus, non-focused incoherent lamps are generally preferred.

Through the use of lamps and light energy, the process of the present invention offers many advantages over conventional chemical vapor deposition processes incorporating furnaces and other similar heat sources to generate the solid material. For instance, the turnon and turnoff times of the lamps (the lamps provide instantaneous energy, typically requiring no substantial startup period) are much higher than the conventional furnaces. Thus the use of incoherent light sources and the low thermal mass of the substrate provides much higher heating and cooling rates than conventional furnaces, providing a rapid photo thermal processing system.

Further, the energy emitted by the lamps can be easily and precisely controlled and varied. For instance, during the process of the present invention, as the liquid precursor is formed into a solid, the energy absorbed by the liquid droplets has a tendency to cool the surrounding atmosphere. Light energy, as opposed to other energy sources, can be instantaneously increased during the process if necessary in order to maintain the reaction conditions constant. Specifically, light energy allows instantaneous recovery from any reactions or transformations occurring that are endothermic.

By using light energy and the use of lamps, the reaction rate and the rate at which the solid is formed can also be accurately controlled. For instance, formation of the solid during the process of the present invention can be abruptly stopped at any time simply by turning off the lamps and discontinuing the flow of light energy to the reaction chamber. The lamps can also be equipped with gradual power controls that can be used to increase or decrease the reaction rate with very quick response times. In the past, chemical vapor deposition processes typically used furnaces which only gradually heat up and cool down. Furnaces and other similar devices, as opposed to lamps, require a substantial amount of lag time between adjusting the power controls and the effect the adjustment has on the reaction or process being carried out. As compared to furnaces, the use of light energy provides a sharp control of the interface between the substrate and the depositing material with higher throughput and lower defects.

Because light energy is used during the process of the present invention, reactor vessel 16 in one embodiment, is made from or lined by a material that acts as an insulator, has a low thermal mass, and is a poor heat conductor. By using a material that does not absorb heat or light energy, the energy requirements of the process are minimized. For instance, in one embodiment, reactor vessel 16 can be made from quartz and can include a substrate holder also made from quartz. Alternatively, the substrate holder can be made from graphite coated with silicon carbide.

As described above, light energy can be used to provide thermal energy to the processing chamber. In addition to using light energy, however, in some embodiments, other heating devices may be used in combination with lamps. For instance, a heating device can be placed below the wafer during the processing. The heating device can be a passive heating device or an active device such as an electrical resistance heater. In one embodiment, a special silicon wafer or other substrate can be used as a heating element. For example, in one embodiment, polysilicon can be deposited on a silicon wafer or other substrate with dimensions similar to the dimensions to the wafers to be processed. Such heating devices can be used to promote temperature uniformity throughout the wafer.

Moreover, in certain applications, such as in the processing of solar cells, natural gas can be used as a source of thermal energy. In some embodiments, a heating assembly utilizing natural gas can be positioned below the substrate. This positioning can be effectively utilized in both batch processing and single-wafer processing.

In another embodiment, the lamps used to supply light energy to the process of the present invention can be placed inside the reactor vessel itself. In this embodiment, reactor vessel 16 can be made from any suitable material, including metals. By placing the lamps inside reactor vessel 16, the vessel need not be made from an insulator material.

Referring to FIG. 2, one embodiment of a reactor vessel 16 that may be used in the process of the present invention is illustrated. Reactor vessel 16 includes a nozzle 14 which atomizes and directs a liquid precursor onto a substrate which is supported on a substrate holder 19. As described above, in accordance with the present invention, nozzle 14 is in communication with a sonic energy source, such as a soundwave producing device. The liquid precursor is contacted with the sonic energy during atomization. Substrate holder 19 is adapted to receive a thermocouple 21 for monitoring the temperature of the substrate during the process. Reactor vessel 16 further includes a lamp 28 which is generally adapted to emit thermal energy and lamps 24 and 26 which are generally adapted to emit optical energy.

In this embodiment, reactor vessel 16 also includes a vacuum line 23 which can be used to create a vacuum within the vessel. On the other hand, if it is desired to pressurize the vessel or to maintain an inert atmosphere within the vessel, a gas line 27 is provided for introducing a gas into reactor vessel 16. Gas line 27 can also be used to introduce a gas into reactor vessel 16 for reaction with the liquid precursor. A conduit 25 is adapted to receive a pressure gage for monitoring the pressure during the process.

Reactor vessel 16 as shown in FIG. 2 further includes a cooling line 29, which is wrapped around the outside perimeter of the vessel. Cooling line 29 is adapted to circulate a cooling fluid such as water if desired. For instance, a cooling fluid can be circulated through line 29 in order to control and maintain the temperature within reactor vessel 16.

Referring to FIG. 1, the process of the present invention can be fully automated if desired. For example, the system can include a controller 30 such as a microprocessor or computer. Controller 30 is in communication with lamps 24, 26 and 28 and in communication with a temperature controller 32. Temperature controller 32 monitors the temperature of substrate 18, such as through a thermocouple as illustrated in FIG. 2. Besides thermocouples, the process of the present invention can also include radiation sensing devices, such as pyrometers for measuring the temperature of the substrate. Temperature controller 32 is also in communication with a valve 34, such as a solenoid valve.

In this arrangement, controller 30 can receive information from temperature controller 32 and, based on the information, control the amount of thermal light energy emitted by lamp 28 (and, if emitting thermal energy, lamps 24 and 26). Controller 30 also controls the flow rate of the liquid precursor from liquid reservoir 10 to nozzle 14. For instance, controller 30 can be programmed to only feed the liquid precursor into reactor vessel 16 when substrate 18 is within a particular temperature range. Further, the temperature within reactor vessel 16 can be maintained and controlled by automatically adjusting the amount of energy emitted by lamps 24, 26 and 28. Thus, a further benefit to using light energy in the process of the present invention is the ability to accurately control the process and the reaction conditions from a remote location.

As described above, in this embodiment of the present invention, when using sonic energy in combination with light energy, the system is particularly well adapted to depositing metal layers on substrates, such as on semiconductor wafers.

Examples that can be deposited on substrates according to this embodiment of the present invention include the following:

| Material to be Deposited | Precursor | Type of Material |
|---|---|---|
| Al | dimethylaluminumhydride (DMAH) | conductor |
| InP | trimethyl indium and tertiarybutylphosphine | semiconductor |
| $Ta_2O_5$ | $Ta(OC_2H_5)_5$ | dielectric |

Of course the above Table just represents examples of various materials that may be used in the process of the present invention and is not intended to limit the invention.

The system of the present invention can be operated as a stand alone unit for depositing a single layer or multiple layers of a material on a single substrate. Alternatively, the apparatus of the present invention can be incorporated into an integrated system for continuously depositing a single layer or multiple layers of a material on a plurality of substrates. For instance, a conveying device can automatically feed substrates into reactor vessel 16 where a film or a plurality of films are deposited upon the substrate. The conveying device can then also be used to remove the substrates from the reactor vessel and then, if desired, place the substrates in a second reaction vessel for depositing other layers of a different material on the substrates. As many systems as illustrated in FIG. 1 as are needed for the particular application can be placed in succession for automatically starting with a substrate and ending with a finished product.

As stated above, the process of the present invention is particularly well suited for use in the manufacture of next generation of integrated circuit chips. In particular, the process can be used to deposit various materials for different purposes in an integrated circuit.

EXAMPLE

As described above, the combination of light energy and sonic energy according to the present invention is well suited to depositing metals on semiconductor wafers. In a preferred embodiment, the light energy emitted from the lamps includes ultraviolet light. The purpose of this example is to not only demonstrate that metal layers can be deposited on semiconductor wafers, but also that ultraviolet light provides various benefits and advantages.

A liquid precursor solution containing dimethylaluminumhydride (DMAH) was purchased from Strem Chemicals. The solution was sprayed onto a semiconductor wafer in the presence of light energy and thermal energy in a processing chamber similar to the one illustrated in FIGS. 1 and 2.

Specifically, hydrogen-terminated silicon wafers were placed in a processing chamber on an electrical resistance heater. The DMAH precursor fluid was then drawn through a nozzle with $N_2$ carrier gas at a flow rate of 0.55 ccm and subjected to sonic energy in an amount of greater than 10 atmosphere. The precursor solution was converted into droplets which fell towards the substrate. Experiments were performed with and without using the vacuum ultraviolet lamps. Further, experiments were performed at temperatures of 200, 220, 240, 260, and 280° C. for time periods equal to or less than 2½ minutes.

Aluminum films of good quality were deposited onto the hydrogen-terminated silicon wafers. The films exhibited good adherence and toughness. At 200, 220, and 240° C., no deposition occurred when only a short time frame was allowed. At 280° C., optimum deposition occurred. Nearly instantaneous deposition was observed at this temperature.

During this experiment, very high throughput rates were observed, such as up to 18 microns per minute. The resistivity of the Al films was 3.4 micro-ohm-cm, which is comparable to the bulk values. Film thickness varied from 1 micron to 20 microns and films were deposited in times of from 1 minute to 3 minutes. As described above, the substrates were hydrogen-terminated silicon wafers. It is believed that the hydrogen-terminators participate in the surface reaction mechanism by which the DMAH precursor breaks down and aluminum deposits. More complete hydrogen termination reduces incubation time and improves film uniformity by providing a greater number of favorable sites for aluminum nucleation.

Figure 3:
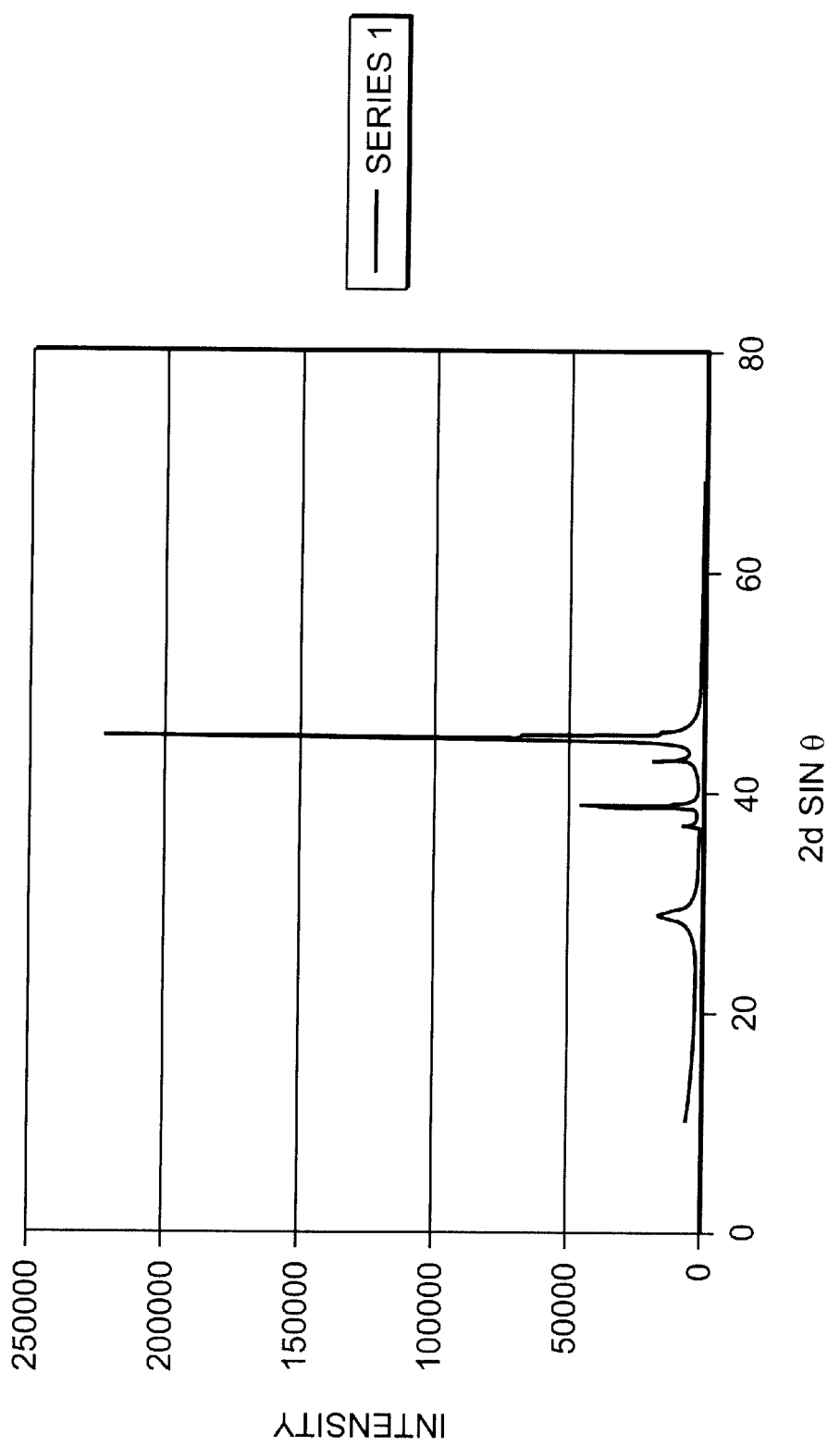
FIGS. 3 and 4 are the graphical results of the example described below.
Figure 4:
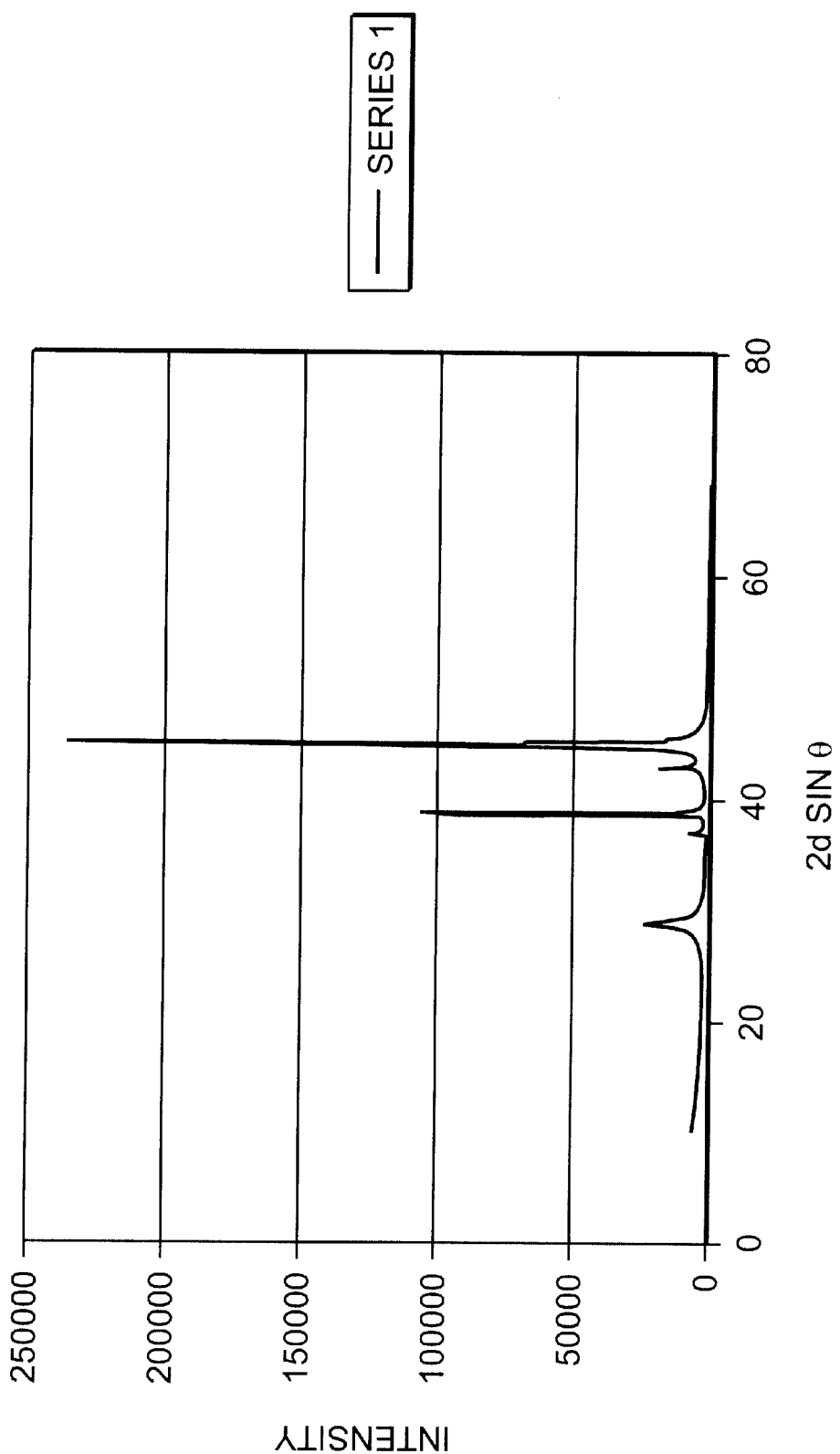

Referring to FIGS. 3 and 4, X-ray defraction results of aluminum deposited with vacuum ultraviolet light (FIG. 3) and without vacuum ultraviolet light (FIG. 4) are shown. As illustrated, the use of vacuum ultraviolet light reduces the defects in the deposited films.

Referring to the figures, the two smalls peaks represent tungsten and originated from the measuring instrument and not from the samples. The two large peaks, however, indicate preferred orientations of (200) and (111). Note that a single crystal orientation (200) is more highly preferred and a higher ratio of (200) and (111) orientation indicates lower defects. In this experiment, the ratio of the (200) peak to the (111) peak is 4.5 and 2.3 respectively. These results show the advantages of using vacuum ultraviolet light in forming films with higher throughput and lower defects.

THE USE OF A COMBINATION OF LIGHT ENERGY AND AN ELECTRIC FIELD IN PROCESSING CHAMBERS

Figure 5:
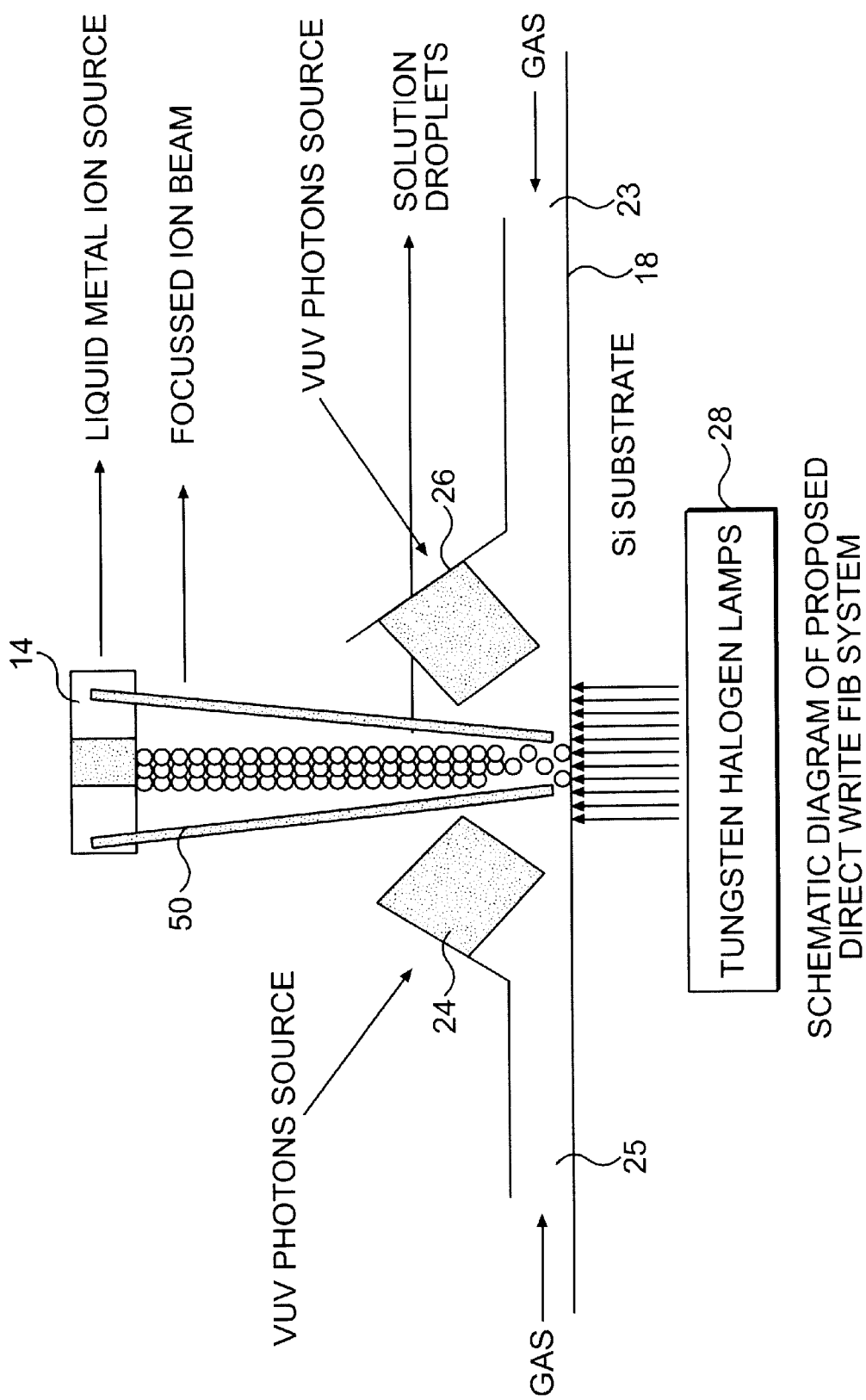
FIG. 5 is a cross-sectional view of an alternative embodiment of a reactor vessel that may be used in the process of the present invention.

Referring now to FIG. 5, a second embodiment of an apparatus and a process in accordance with the present invention is illustrated. In this embodiment, the process uses a combination of light energy and an electric field to directly deposit a parent material on to a substrate. The electric field can be, for instance, created by a focused ion beam, focused electron beam or by an electromagnetic field. In this embodiment, the process can be used for direct writing onto semiconductor wafers in forming integrated circuits.

When forming integrated circuits, most of the materials that are deposited onto the semiconductor wafer have to be deposited in a preselected pattern. In order to produce these patterns, in the past, materials called resists were first deposited onto the substrate. The resists were then etched in order to form a pattern in the resist. This pattern or "mask" layer is then used in depositing a separate material onto the semiconductor wafer. In particular, when another material is deposited onto the wafer, the material is deposited into the pattern formed into the resist layer. The resist layer is then typically removed leaving behind the subsequently deposited material according to the preselected pattern. This process is typically known as "lift off" but the principle applies equally well to an "etch back process". The embodiment illustrated in FIG. 5, however, is directed to a direct writing process removing the need for depositing a resist material and for etching the resist.

In the past, various processes have been proposed that also do not require the use of a resist. Those processes, however, were too slow to be commercially feasible. The process of the present invention, on the other hand, is believed to have a high throughput through the use of an electric field in combination with light energy.

As shown in FIG. 5, in this embodiment, the thermal processing system includes a nozzle 14 through which a parent material is directed. As the parent material enters the processing chamber, the material is subjected to light energy from lamps 24, 26 and 28. The material is directed onto a substrate 18.

In this embodiment, the parent material entering the chamber can be subjected to sonic energy as described above if desired. Of importance, however, is that the parent material, when in liquid form, be in the form of very small droplets. For instance, the parent material should be atomized into droplets having a diameter of less than about 0.5 microns, and particularly less than 0.1 microns.

The light energy emitted by the lamps can be optical energy or thermal energy as described above with respect to FIGS. 1 and 2. Preferably, lamps 24 and 26 emit ultraviolet light, such as vacuum ultraviolet light. Lamps 28, on the other hand, are, in this figure, used to heat substrate 18. It should be understood, however, that besides lamps 28, an electrical resistance heater can also be used or any other suitable heating device.

The optical energy used in the system should have a wavelength less than about 400 nm for most applications. The lower limit of the photons will be set by the nuclear interaction of the parent material and the photon wavelength. Thus, when the photons interact with the precursor material to be deposited, only electronic excitations should take place and no significant displacement of the ions should occur. Only photons with energy higher than the threshold of the cut off wavelength should be used.

As shown in FIG. 5, the system further includes an electric field 50 for directing the parent material onto the substrate in a preselected pattern. For instance, using a focused ion beam or a focused electron beam, the precursor material which can be either in gaseous form or in the form of ultrafine liquid nanodroplets as described above, will interact with the photons and the direct writing will take place on the substrate.

In order to form a pattern onto the substrate, during the process, either the electric field can be moved, or the substrate itself can be maneuvered.

In general, in this embodiment, electric field 50 as shown in FIG. 5 is created by placing a voltage across two plates creating a potential difference. The electric field controls the direction and the speed of the parent material as it enters the chamber allowing the parent material to be deposited according to a predetermined pattern.

Materials that can be deposited according to this embodiment of the invention include semiconductors, conductors, dielectrics (organic or inorganic), and polymers for the fabrication of integrated circuits and other related devices. For instance, aluminum films can be deposited onto a substrate in accordance with this embodiment by utilizing an aluminum precursor material.

USE OF A STRESS MEASUREMENT DEVICE IN A PROCESSING CHAMBER

Figure 6:
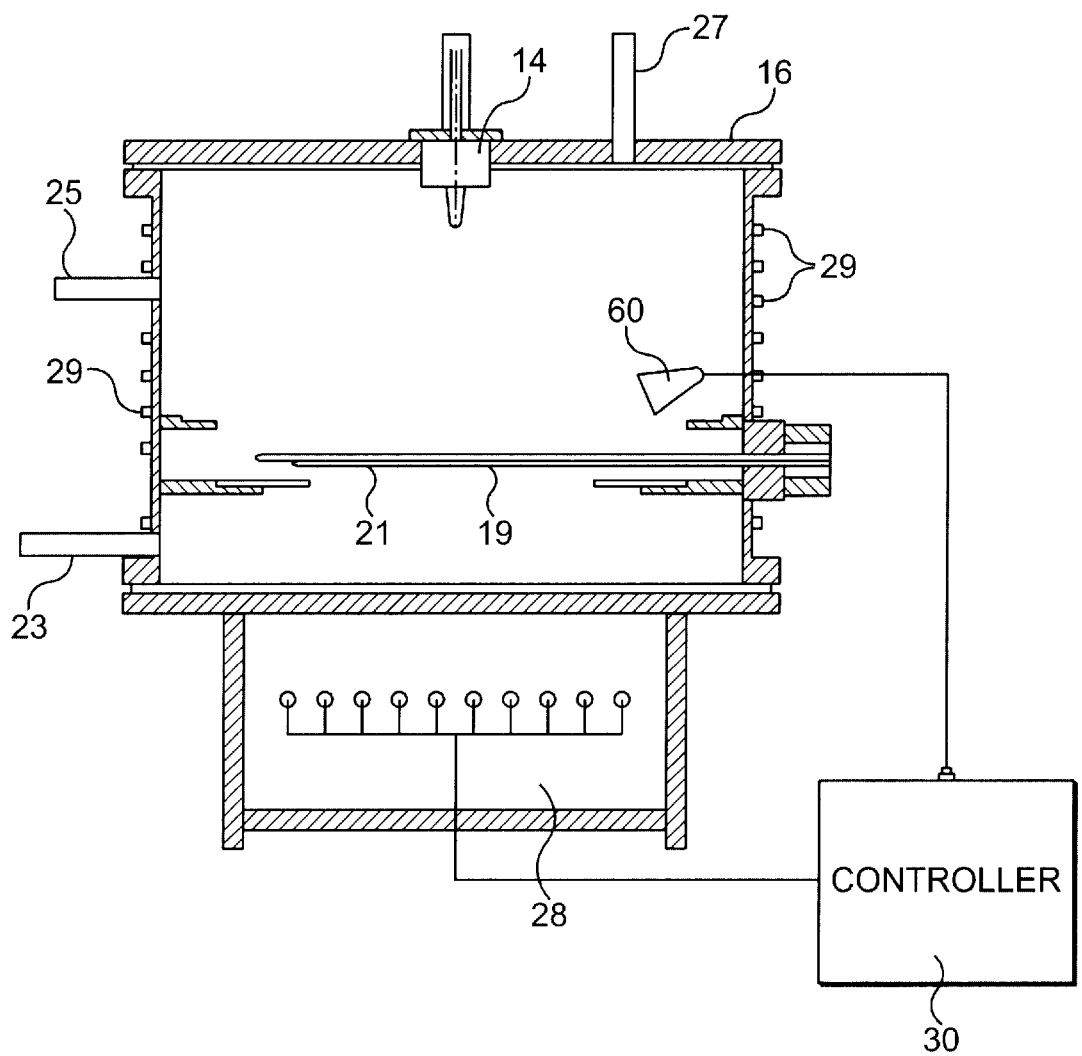
FIG. 6 is still another alternative embodiment of a reactor vessel that may be used in the process of the present invention.

Referring to FIG. 6, a third alternative embodiment of a system and process to be used in accordance with the present invention is illustrated. This embodiment is directed to controlling the amount of stress that is formed in a layer deposited on a substrate as the layer is being created. This embodiment of the present invention is directed to minimizing stress in order to prevent defects from forming in the layers.

In general, in this embodiment of the present invention, as a layer is being formed on the substrate, a stress measurement device is used to simultaneously measure the stress in the layer. The stress measurement device is then connected to a controller for controlling the amount of energy used in forming the layer. Based upon the stress measurements taken by the stress measurement device, the amount of energy being supplied by various sources as well as the flow rate of the precursors involved in the process are varied in order to produce a layer having optimal properties.

This embodiment of the present invention can be used with the embodiments illustrated in FIGS. 1–9 or can be used with conventional thermal processing chambers, including rapid thermal processing chambers which are designed to process semiconductor wafers. Further, the manner in which the layer is formed is typically not critical to this embodiment of the present invention. The layer being formed, for instance, can be formed from a liquid, a gas, a paste, or a combination of the above.

As shown in FIG. 6, in this particular embodiment, a thermal processing chamber is illustrated containing a substrate holder 19 adapted, for instance, to hold semiconductor wafers. Substrates contained within the chamber are exposed to light energy being emitted by lamps 28 which can be configured to emit thermal energy, optical energy or a combination of thermal and optical energy. Further, lamps 28 can be placed at other locations around the chamber, such as above the chamber for heating semiconductor wafers as desired.

The chamber further includes a plurality of gas lines 23, 25 and 27 which can be used to circulate gases within the chamber. For example, gases can be directed into the chamber for reaction with the substrate. Alternatively, the gas lines can be used to either pressurize the chamber or to create a vacuum within the chamber.

In accordance with the present invention, the processing chamber further includes a stress measuring device 60 connected to a controller 30. Controller 30, in turn is connected to lamps 28. Stress measurement device 60 is configured to determine the thermal stress of a substrate being processed within the chamber and is configured to send the information to controller 30. Controller 30, on the other hand, is configured to receive the information and, based upon the amount of stress present within the substrate, adjust the amount of light energy being emitted by lamps 28. In this manner, layers can be formed upon the substrate having optimal properties.

The stress measurement device used in the process of the present invention can vary depending upon the particular application. For instance, various stress measurement devices that may be used in the present invention are disclosed in "The Science and Engineering of Materials" by Askeland, 1994; "Thin-Film Deposition: Principles and Practice" by Smith, 1995; "Stresses in Multilayered Thin Films" by Cammarata, et al. MRS Bulletin, February 1999; "Determination of Film Stresses During Sputter Definition Using an Insitu Probe" by Hoffman, J. VAC. SCI. TECHNOL., Volume 3, Number 6, November/December 1985; "Measurement and Interpretation of Stress in Aluminum-Based Metalization as a Function of Thermal History" by Flinn, et al., IEEE Transactions on Electron Devices, Volume ED-34, Number 3, March 1987; and "Analysis of Thin Film Stress Measurement Techniques" by Malhotra, et al., Thin Solid Films 301, 1997, which are all incorporated herein by reference in their entireties. In addition, the measurement of stress in the present invention can also be accomplished by atomic force microscopy.

Particular examples of stress measurement devices that may be used include a strain gage which is used to measure the amount that the substrate stretches between gage marks when the substrate is under stress.

In an alternative embodiment, the stress measurement device can comprise an optical system which measures the bending or curvature of the substrate or layer as the layer is being formed. For instance, very small curvatures appearing on the surface of a substrate can be measured by the change in angle of reflection of a light source, such as a laser beam, as it is scanned across the substrate.

Similar to or included within optical systems, interferometry can also be used to measure stress. Optical interferometers use the interference of light waves in order to measure very small distances and thicknesses.

In another alternative embodiment, the stress measurement device can use X-ray diffraction in order to measure stress. According to the X-ray diffraction method, an X-ray beam is directed incedent onto the substrate. The amount of diffraction of the beam is then sensed in order to determine stress.

In still another alternative embodiment, the stress measurement device of the present invention can include a laser and an instrument capable of monitoring color changes. In this embodiment, a laser beam or other light source is directed onto the substrate. The color monitor then determines color changes of the substrate which indicate the amount of stress that the substrate is under.

In a further alternative embodiment, the stress measurement device can be an atomic force microscope (AFM). The AFM can measure strain by looking at an array of atoms such as, for instance, 100×100 (approximately 0.05 microns) and checking the X and Y dimensions. If the lattice is strained either compressed or stretched in either the x direction, the y direction or both, the dimension change compared to a non-strained lattice can be measured. For the control of homogenous microstructures, only measurement of strain is required. This gives a +/−(delta L)/L with the sign indicating compressive or tensile forces. This measurement can then be converted to stress using the following equation: stress=strain×YM. In the above equation YM is the Youngs Modulation. Any deformation of the lattice structure can be measured. Specifically, within a grain, an array of atoms size can be compared with theoretical data and any difference would indicate strain. Several grains can also be measured and the x and y dimensions can be compared with a reference, were the reference is the same dimension measured for a film with zero stress.

As described above, the amount of stress determined by the stress measurement device is communicated to a controller which in turn automatically makes adjustments in the amount of light and other form of energy used in producing films and layers on the substrate. In particular, localized stress determined by the stress measurement device is communicated to the controller which in turn automatically adjusts the droplet size and/or energy levels for producing uniform layers with low stress.

Each of the above described embodiments of the, present invention as illustrated in FIGS. 1–10 provide various advantages not before realized by prior art constructions. In general, the systems allow for the deposition and heat treating of substrates, such as semiconductor wafers, while decreasing and reducing the number of defects that are formed during the process.

The various processes of the present invention also provide for the deposition of layers on substrates at temperatures lower than many conventional processes. There are many advantages and benefits to conducting processes at lower temperatures. For example, typically less energy and less time is required in forming the layers on the substrates. Further, higher temperatures tend to create greater amounts of stress in the substrate and in the layers that are formed on the substrate. By reducing the temperature during processing, less stress is produced in the finished product.

The present invention is highly suitable in reducing the process temperature of a particular thermal step. For instance, many materials can be deposited at less than 700° C. For instance, silicon diffusion can be carried out at a temperature of 650° C. State of the art rapid thermal processing systems typically carry out such diffusion processes at temperatures of greater than 850° C. The sheet receptivity of a diffused layer made in accordance to the present invention can be lower than 30 ohm/sq., and particularly less than 20 ohm/sq. Minority carrier lifetime is a direct indicator of the defects present in the starting semiconductor wafer as well as introduced by a particular process. The measured increase in the minority carrier lifetime of a diffused layer made according to the present invention is at least 10 microseconds, and particularly at least 14 microseconds. These results clearly demonstrate that the process of the present invention can drastically reduce the processing temperature and significantly reduce the defects. Due to these features, the present invention is highly suitable for manufacturing silicon integrated circuits on large diameter wafers as well as large area devices such as bulk and thin film cells on low-cost substrates.

THE FABRICATION OF SOLAR CELLS

The present invention is particularly well suited to treating semiconductor wafers and to fabricating integrated circuits. It should be understood, however, that the present invention can also be used in many other applications. For instance, the process of the present invention is also particularly well suited for use in the production of solar cells. For processing solar cells, there is a need to increase the performance of the device and simultaneously increase the throughput of the processing system. Current bulk silicon solar cells are mostly manufactured using belt furnaces. It is believed, however, that the use of light energy as described above will make the process faster and more efficient, especially when using vacuum ultraviolet light photons.

Solar cells generally utilize the properties of a semiconductor to convert light from the sun into electricity. A variety of different materials can be used to fabricate a solar cell according to a variety of different methods. For instance, solar cells are commonly formed from multiple layers of materials. When forming a solar cell from one or more layers of material, any of a variety of deposition techniques, such as direct liquid injection, chemical vapor deposition, etc., can be used. One particular example of a process for producing a multi-layered solar cell is described in more detail below.

A base layer, which is made from a material such as glass or other low-cost substrate, can be initially provided to begin formation of the solar cell. Thereafter, a first metal layer or coating can be screen printed onto the substrate. As used in the present invention with respect to solar cell fabrication, a "substrate" generally refers either to the base layer alone or a base layer in conjunction with any number of layers applied thereto. Once deposited, the first layer can then be annealed to optimize the properties of the solar cell. After applying the first metal layer, a second layer of silicon can then be deposited thereon using various deposition techniques, such as chemical vapor deposition or direct liquid injection. This second layer of silicon can, in some embodiments, contain p-type silicon having a thickness of about 25 microns to about 50 microns.

Once the second layer is applied, a third layer of silicon can also be applied as described above. This third layer of silicon can, in some embodiments, contain n-type silicon. After each silicon layer has been applied, a dopant can then be spun onto the third layer and heated. A fourth layer of a metal contact can then be screen printed onto the doped third layer. Thereafter, a fifth layer comprising anti-reflection components can be applied. In addition to the layers described above, a sixth layer comprising a passivation and/or capsulation component can optionally be applied.

Although the embodiment of the solar cell described above includes six layers, it should be understood that a solar cell of the present invention is not limited to six layers. In fact, any of the layers and/or processing steps mentioned above can be removed, if desired. Moreover, additional layers and/or processing steps can also be utilized. Further, it should also be understood that the layers utilized in a solar cell of the present invention are not limited to the materials described in the embodiment described above, and that any other suitable materials can be utilized.

During solar cell fabrication, it is typically necessary that some energy source, such as light or thermal energy, be utilized to form a certain layer onto the substrate while simultaneously performing a processing step, such as annealing, diffusion, oxidation, etc. Current bulk silicon solar cells are typically manufactured using belt furnaces. However, a need exists to increase the performance of the device and simultaneously increase the throughput of the processing system.

As such, one embodiment of the present invention is directed to utilizing light energy, as described above, at various stages of the solar cell fabrication process to increase processing speeds and efficiency. For example, referring to FIGS. 7–8, an embodiment of one stage of a solar cell fabrication system generally 200 is illustrated. As shown, the system 200 can include one or more substrates 250 that can be maneuvered by conveyor belt 260 so that they are exposed to lamps 210, which are vertically oriented with respect to the substrates. In general, conveyor belt 260 can be made from any type of material. However, in some embodiments, the conveyor belt may be made from a ceramic material so that the belt will not be adversely affected during heating.

In an alternative embodiment not shown, instead of using conveyor belt 260, the substrates can be placed on a stationary platform and lamps 210 can move over the substrates. For instance, the lamps can be mounted to a moving frame above the substrates.

Figure 7:
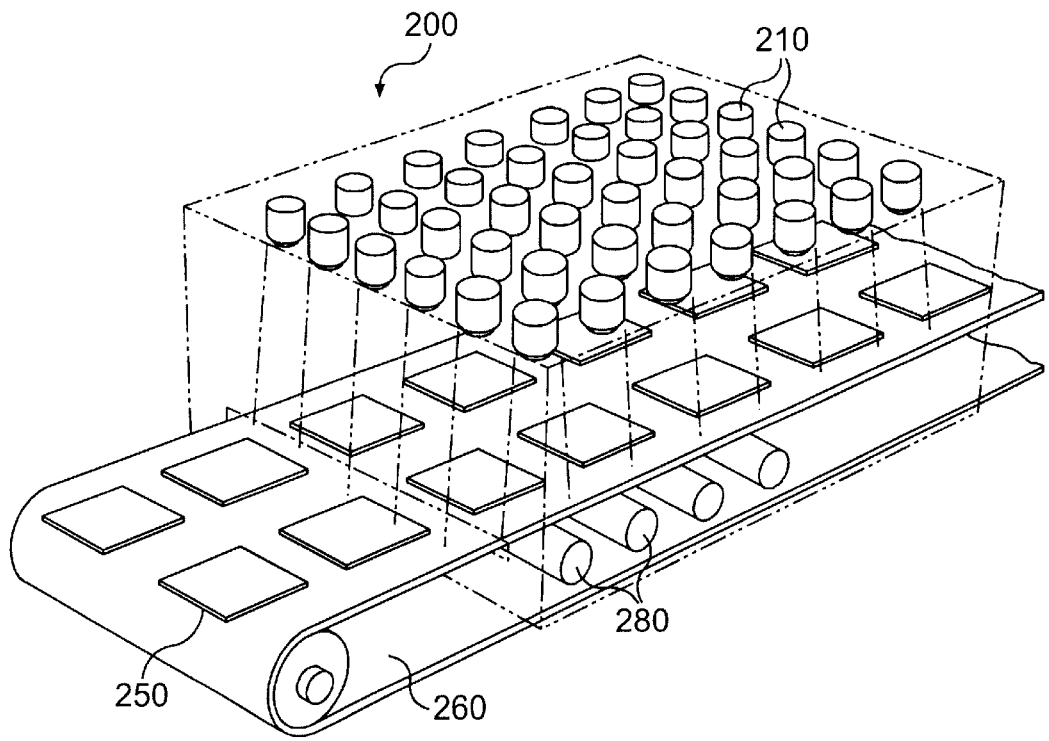
FIG. 7 is a perspective view of one embodiment of a system for depositing a material used in the manufacturing of solar cells.
Figure 8:
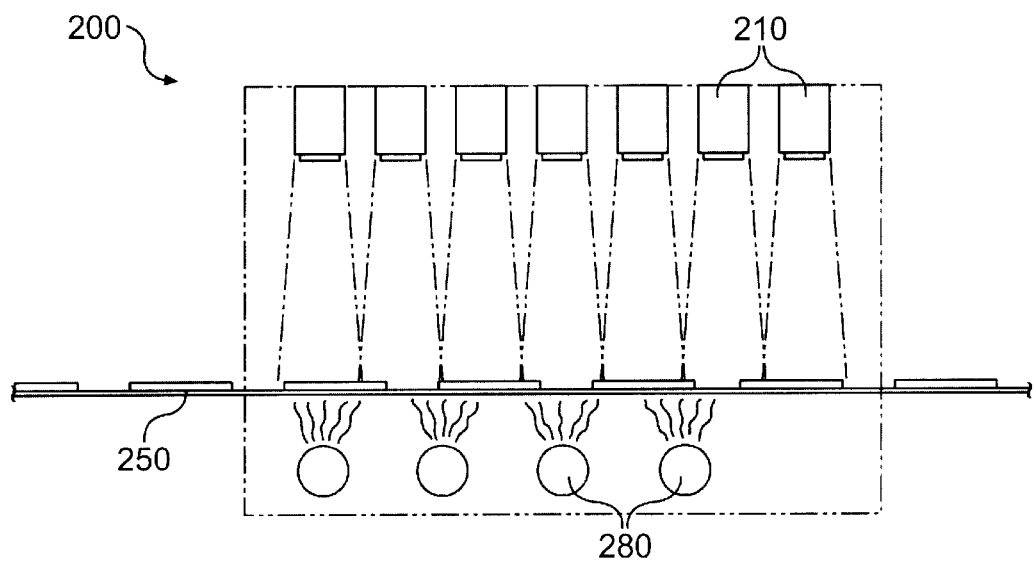
FIG. 8 is a front view of the embodiment illustrated in FIG. 7.

In the embodiment depicted in FIGS. 7–8, lamps 210 are arranged within system 200 above substrates 250 so that light produced by the lamps 210 effectively contacts the top portion of the substrates. Moreover, it should be understood that lamps 210 can be arranged within the system in any other position or location desired, so long as the energy produced by the lamps can provide light energy to substrates 250.

Lamps 210 can generally emit either optical energy, thermal energy, or both. Although either energy source can be utilized, lamps 210 are illustrated in FIGS. 7–8 as emitting optical energy. Optical energy can be provided by ultraviolet light, vacuum ultraviolet light, and visible light, which is present at wavelengths of from about 0.05 microns to about 0.8 microns. Light at wavelengths in the range of from about 0.4 microns to about 0.8 microns, which can provide both optical energy and thermal energy, can also be produced by light energy source of the present invention. Moreover, any type of lamp can generally be used in the present invention to emit optical or thermal energy. For instance, in one embodiment, linear lamps that produce vacuum ultraviolet light can be utilized.

In addition to lamps 210, system 200 of the present invention can also include heaters 280 to provide a further energy source for substrates 250. Although heaters 280 can generally comprise any energy source, FIGS. 9–10 illustrate one embodiment of the present invention in which heaters 280 are gas heaters that combust a gas such as methane.

Solar cell fabrication system 200 as shown in FIGS. 7 and 8 can be used for various processes. Specifically, the system can be used for practically any step in the production of solar cells. Such steps can include diffusion, annealing or film formulation.

Figure 9:
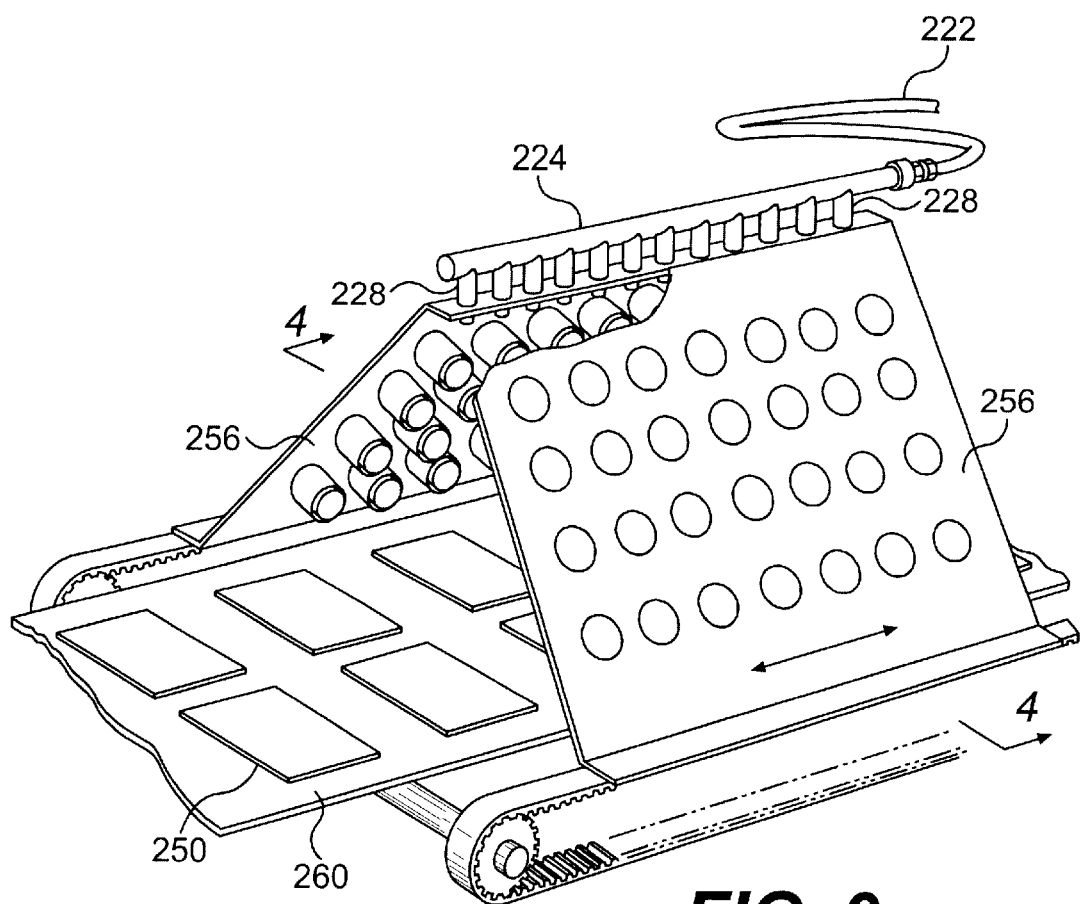
FIG. 9 is a perspective view of another embodiment of a system for depositing a material used in the manufacturing of solar cells.
Figure 10:
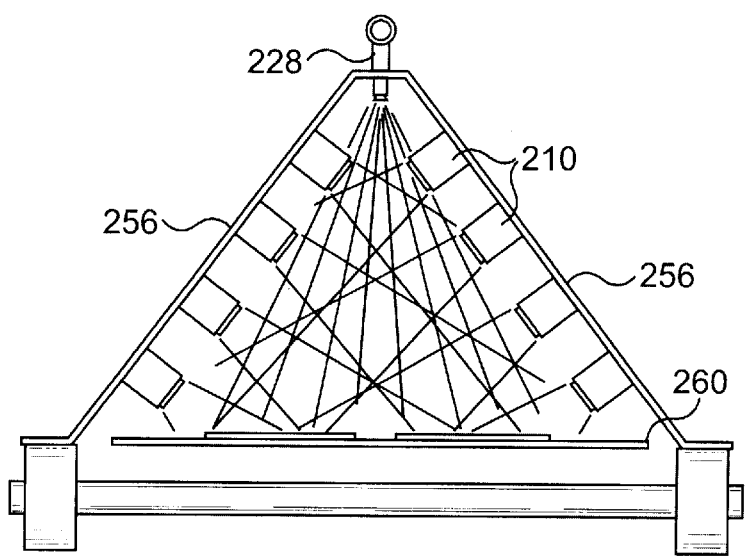
FIG. 10 is a cross-section view of the embodiment illustrated in FIG. 9 taken along a line 4—4.

Referring to FIGS. 9–10, another embodiment of a system for converting a liquid precursor into a coating on a substrate to form a solar cell according to the present invention is illustrated. In order to initiate the process, a liquid precursor is formulated and placed in a liquid reservoir (not shown). The liquid precursor contains, in some form, a parent material that is to be later converted into a solid. The liquid precursor can be a pure liquid or can be a solution. For instance, in one embodiment, the liquid precursor can contain silicon tetrachloride and/or any other suitable precursor liquid used in solar cell processing.

The liquid precursor contained in the liquid reservoir can generally be fed by tube 222 and conduit 224 to one or more nozzles 228, which are more clearly shown in FIG. 9 and described in more detail above. Nozzle(s) 228 can atomize the liquid precursor into liquid droplets. The liquid droplets are directly injected into a reactor vessel towards a substrate 250.

In the embodiment illustrated in FIGS. 9–10, nozzle(s) 228 can atomize the liquid precursor using a pressurized gas. Specifically, the system also includes a gas reservoir (not shown) in communication with nozzle(s) 228. In general, the gas used to atomize the liquid precursor should not adversely interfere with the deposition process. In most solar cell fabrication processes, for example, the gas used can be hydrogen. In some applications, however, inert gases, such as argon or nitrogen, can be used.

As the liquid droplets formed by nozzle(s) 228 fall towards substrate 250, the light energy and any other thermal energy present, such as energy emitted by gas furnaces as shown in FIGS. 1 and 2, contacting the droplets causes the parent material contained within the liquid precursor to form a solid coating on the substrate. More particularly, the light energy can cause various chemical transformations to occur. For instance, in one embodiment, the liquid precursor can be a solution containing a solvent which is evaporated by the light energy. As the solvent is evaporated, the parent material falls out of solution and forms a solid.

Typically, it is desired that the light energy source contact the atomized precursor liquid before the liquid droplets contact the substrates. As such, in some embodiments, as shown in FIGS. 9–10, lamps 210 can be provided on tilted opposing plates 256. Plates 256 can generally be tilted at any of a number of angles relative to a fixed horizontal plane so that lamps 210 can also become tilted. In one embodiment, as shown in FIGS. 9 10, lamps 210 and plates 256 are each tilted at approximately a 45 degree angle with respect to a fixed horizontal plane parallel to conveyor 260. However, lamps 210 and plates 256 need not be tilted. Moreover, it should also be understood that lamps 210 and plates 256 can also be tilted at any of a number of different angles to achieve light energy contact with the liquid droplets. It is also not necessary that each opposing plate be tilted at the same angle.

Besides using tilted plates, it should be understood that lamps 210 can be positioned in other arrangements. For instance, in an alternative embodiment, the lamps can be arranged on a substantially flat base and tilted to provide the same effect as the tilted plates in FIGS. 9 and 10.

As stated above, a system of the present invention can generally be utilized to deposit a material onto a substrate during solar cell processing. For instance, referring to the 6-layer solar cell fabrication example described above, a system of the present invention can be utilized to form the second layer of silicon or the third layer of silicon. In this regard, as stated above, silicon tetrachloride can be used in conjunction with hydrogen to form the silicon layers using a system of the present invention. In particular, silicon tetrachloride can be itemized with hydrogen gas in a system. Once exposed to light energy and thermal energy, the silicon tetrachloride and hydrogen will react forming the silicon layer. It should be understood that the system described herein is not limited to the deposition of silicon onto a substrate, and that various other layers at various stages of solar cell fabrication can be formed utilizing a system of the present invention.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. An apparatus for heating and forming layers on semiconductor wafers comprising:
   a thermal processing chamber adapted to contain a semiconductor wafer;
   a heating device in communication with the thermal processing chamber for heating a semiconductor wafer contained in said chamber, said heating device comprising a plurality of lamps, said lamps emitting at least ultraviolet light;
   a nozzle for introducing a precursor material into said thermal processing chamber, said precursor material forming a coating on said semiconductor wafer;
   a sonic energy device supplying sonic energy to said precursor material as said precursor material passes through said nozzle; and
   wherein the nozzle and sonic energy device are configured to emit the precursor material directly onto a semiconductor wafer contained in the thermal processing chamber.

2. An apparatus as defined in claim 1, wherein said lamps emit vacuum ultraviolet light.

3. An apparatus as defined in claim 1, further comprising a magnetic field device for creating a magnetic field within said thermal processing chamber, said magnetic field directing said precursor material onto said semiconductor wafer.

4. An apparatus as defined in claim 1, wherein said sonic energy comprises ultrasonic energy.

5. An apparatus as defined in claim 1, further comprising a temperature sensing device for sensing the temperature of said semiconductor wafer as said wafer is heated.

6. An apparatus as defined in claim 5, wherein said temperature sensing device comprises at least one pyrometer.

7. An apparatus as defined in claim 1, further comprising a gas inlet for directing a gas into said thermal processing chamber.

8. An apparatus as defined in claim 1, wherein said precursor material comprises a liquid.

9. An apparatus as defined in claim 1, wherein said precursor material comprises a gas.

10. An apparatus as defined in claim 1, wherein the sonic energy device is configured to produce liquid droplets all having a size of substantially less than about 1 micron.

11. An apparatus as defined in claim 1, wherein the sonic energy device is configured to produce liquid droplets all having a size of substantially less than about 0.5 microns.

12. An apparatus for heating and forming layers on semiconductor wafers comprising:
    a thermal processing chamber adapted to contain a semiconductor wafer;
    a heating device in communication with said thermal processing chamber for heating a semiconductor wafer contained in said chamber, said heating device comprising a plurality of lamps, said lamps emitting at least ultraviolet light;
    a nozzle for introducing a precursor material into said thermal processing chamber, said precursor material forming a coating on said semiconductor wafer;
    a magnetic field device located within said thermal processing chamber, said magnetic field device being configured to create a magnetic field in a manner that causes said precursor material to deposit on said semiconductor wafer according to a predetermined pattern.

13. An apparatus as defined in claim 12, further comprising a temperature sensing device for sensing the temperature of said semiconductor wafer as said wafer is heated.

14. An apparatus as defined in claim 13, wherein said temperature sensing device comprises at least one pyrometer.

15. An apparatus as defined in claim 12, further comprising a gas inlet for directing a gas into said thermal processing chamber.

16. An apparatus as defined in claim 12, wherein said precursor material comprises a liquid.

17. An apparatus as defined in claim 12, wherein said precursor material comprises a gas.

18. An apparatus as defined in claim 12, wherein said magnetic field device creates said magnetic field by an ion beam.

19. An apparatus as defined in claim 12, wherein said magnetic field device creates said magnetic field by an electron beam.

20. An apparatus as defined in claim 12, wherein said magnetic field device creates said magnetic field by including a voltage across two plates.

21. An apparatus as defined in claim 12, wherein the sonic energy device is configured to produce liquid droplets all having a size of substantially less than about 1 micron.

22. An apparatus as defined in claim 12, wherein the sonic energy device is configured to produce liquid droplets all having a size of substantially less than about 0.5 microns.

* * * * *